United States Patent [19]

Pace et al.

[11] Patent Number: 4,689,506
[45] Date of Patent: Aug. 25, 1987

[54] CONTROL CIRCUIT FOR USE WITH ELECTRONIC ATTENUATORS AND METHOD FOR PROVIDING A CONTROL SIGNAL PROPORTIONAL TO ABSOLUTE TEMPERATURE

[75] Inventors: W. David Pace, Tempe; Dennis L. Welty, Mesa, both of Ariz.

[73] Assignee: Motorola, Inc., Schaumburg, Ill.

[21] Appl. No.: 772,482

[22] Filed: Sep. 4, 1985

[51] Int. Cl.[4] .................. H03K 3/26; H03K 3/01; G06K 7/10
[52] U.S. Cl. .................. 307/491; 307/254; 307/310; 307/296 R; 323/315; 323/907; 330/257
[58] Field of Search .................. 307/310, 296 R, 491; 323/315, 907; 330/256, 257

[56] References Cited

U.S. PATENT DOCUMENTS 4,587,478  5/1986  Kasperkovitz .................. 307/310
4,591,743  5/1986  Kung .................. 307/310
4,593,208  6/1986  Single .................. 307/310

*Primary Examiner*—Stanley D. Miller
*Assistant Examiner*—B. P. Davis
*Attorney, Agent, or Firm*—Michael D. Bingham

[57] ABSTRACT

A control circuit for developing a modulated voltage which is proportional to absolute temperature that includes a thermal current source for producing current having a predetermined temperature coefficient and current steering circuitry for proportionally steering the current between first and second outputs in response to a direct current bias voltage applied thereto wherein the current at the first output of the current steering circuitry flows through a resistor. The resistor is connected between a source of different current operating potential and the first output of the current steering circuitry whereby the voltage developed thereacross due to the current steered therethrough is proportional to absolute temperature.

12 Claims, 3 Drawing Figures

CONTROL CIRCUIT FOR USE WITH ELECTRONIC ATTENUATORS AND METHOD FOR PROVIDING A CONTROL SIGNAL PROPORTIONAL TO ABSOLUTE TEMPERATURE

BACKGROUND OF THE INVENTION

The present invention relates to electronic attenuators and, more particularly, to a circuit and method for producing a control signal proportional to absolute temperature for controlling the attenuation of such circuits.

The automatic control of attenuator circuits is frequently required in the design of telephones and other audio products. For example, contemporary speakerphones are typically operated in a half-duplex mode of operation wherein transmission and reception of speech audio signals is not permitted simultaneously. Hence, at any particular time, the speakerphone is either in a transmit mode, idle mode or receive mode as is well understood. In order to provide the required half-duplex operation the speakerphone includes a pair of attenuators, a transmit attenuator circuit placed in the transmit signal path of the speakerphone and a receive attenuator circuit in the receive signal path thereof. The transmit and receive attenuators are controlled by a single circuit and are complementary in function, i.e., in response to a control signal supplied from the control circuit, one is operated at maximum gain while the other is operated at maximum attenuation and vice versa. The two attenuators are never both on or both off. Thus, for instance, if the user is speaking, the speakerphone is placed in the transmit mode wherein the transmit attenuator is operated at maximum gain while the receive attenuator is operated at maximum attenuation to inhibit a receive signal from adversely affecting the transmission of the speech signal from the user. Similarly, in response to a controlling received audio signal the receive attenuator is automatically switched to maximum gain while the transmit attenuator is operated at maximum attenuation. In the idle mode, whenever audio signals are neither being transmitted or received, the gains of both the transmit and receive channels are reduced to some mid value thereof.

In at least one prior art speakerphone the transmit and receive attenuators, as well as, the attenuator control circuit, are manufactured in integrated circuit form. The transmit and receive attenuators in this prior art speakerphone are actually a pair of gain controlled two or four quadrant multiplier circuits which are well known to those skilled in the art. The two attenuators have a commonly connected gain control input to which the gain control signal is applied. The gain control inputs of the two multiplier circuits are such that, in the absence of a gain control signal, the transmit attenuator is operated at maximum gain while the receive attenuator is operated at maximum attenuation.

A problem arises due to the temperature dependency of the multiplier circuits, i.e., the gain of the transmit and receive attenuators varies as a function of temperature. This is undesirable as the gains of each attenuator should remain constant in order to provide high quality speakerphone operation.

At least one manufacturer, in an attempt to provide temperature compensation, uses an external thermistor to produce a current internally to the integrated speakerphone circuit which has a predetermined temperature coefficient. This internally generated current produces a control voltage that drives the two attenuators. In this manner the control voltage has a temperature characteristic which approximates the gain verses temperature characteristics of the two attenuators. However, a problem exists with this temperature compensation scheme in that the control voltage does not precisely track the variations and the gain of the attenuators over temperature because the temperature characteristic of the external thermistor does not track that of the integrated circuit attenuator circuits. This can produce an undesirable offset between the relative gains of each of the two attenuators whereby the log gains thereof do not remain constant.

Hence, there exists a need for an attenuator control circuit that produces a control voltage at an output that is proportional to absolute temperature which can be used to control the gain of integrated circuit attenuators of the type described above.

SUMMARY OF THE INVENTION

Accordingly, it is an object of the present invention to provide an improved circuit for producing a drive voltage the temperature characteristic of which is proportional to absolute temperature.

Another object of the present invention is to provide an integrated circuit for producing a voltage at an output thereof that is proportional to absolute temperature.

Still another object of the present invention is to provide an attenuator control circuit for controlling the gain/attenuation of electronic attenuators by providing a voltage that is proportional to absolute temperature.

Yet another object of the present invention is to provide an attenuator control circuit suitable to be used in a speakerphone or the like having a pair of complimentary operated attenuators for producing a control voltage to vary the gains of the attenuators wherein the control voltage is proportional to absolute temperature.

In accordance with the above and other objects there is provided a circuit for producing an output signal having a temperature coefficient proportional to absolute temperature which comprises a current source for providing a current having a predetermined temperature coefficient, a first current steering circuit for proportionally steering said current between first and second outputs whenever the first current steering circuit is rendered operative, a second current steering circuit for proportionally steering a current having substantially the same temperature coefficient as the current provided by the current source between first and second outputs whenever the second current steering circuit is rendered operative and switching circuitry coupled between the first and second current steering circuits to the current source which is responsive to a control signal applied thereto for rendering one of the first or second current steering circuits operative while the other is rendered nonoperative.

DETAILED DESCRIPTION OF THE PREFERRED EMBODIMENT

Figure 1:
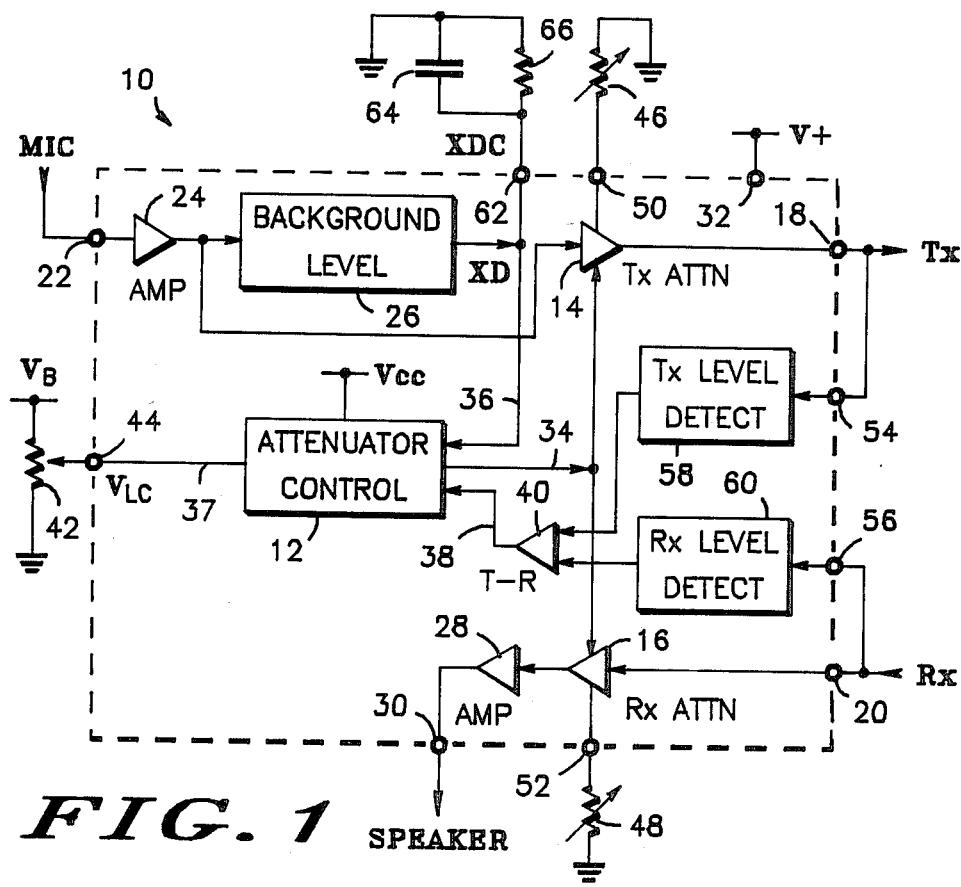
FIG. 1 is a partial block and schematic diagram illustrating a speakerphone including an attenuator control circuit of the present invention.

Turning to FIG. 1 there is shown a simplified block diagram of an integrated speakerphone circuit within dashed outline 10 which incorporates attenuator control circuit 12 of the present invention. As understood, the speakerphone provides hand free communication in a half-duplex mode operation. Half-duplex operation is provided by controlling the gain-attenuation of attenuators 14 and 16 which are respectively situated in transmit and receive signal paths of the speakerphone. The speakerphone, in a typical application, is coupled to telephone lines at terminals 18 and 20 to provide voice transmission and reception thereover. Attenuator control circuit 12 controls the gain of the two attenuators and is voice activated to place the speakerphone in either a transmit or receive mode accordingly. The transmit signal path comprises a microphone (not shown) coupled externally at input 22 to audio amplifier 24. The output of audio amplifier 24 is connected both to a background level detector 26 and the input of transmit attenuator 14, the output of the latter being connected to output terminal 18. Likewise, the receive signal path includes receive attenuator 16 coupled between terminal 20 and audio amplifier 28. A speaker (not shown) is externally connected at terminal 30 to the output of audio amplifier 28. A source of operating potential V+ is provided to the speaker phone at terminal 32 and is utilized to derive the power supply voltage $V_{CC}$ for biasing the internal circuitry of the speakerphone. As will be described in more detail later, the speakerphone is voice switched to be operated in either a transmit mode or receive mode. Depending on the particular mode of operation, attenuator control circuit 12 provides a voltage via lead 34 that commonly drives transmit and receive attenuators 14 and 16 accordingly. As previously mentioned, transmitter and receive attenuators 14 and 16 are complimentary in function, i.e., when one is operated at maximum gain the other is operated at maximum attenuation and vice versa.

The operation of attenuator control circuit 12 is controlled by the three control signals supplied thereto. These signals are, (1) a background level signal XDC supplied via lead 36, (2) a volume level control signal VLC supplied via lead 37, and (3) a control signal applied over lead 38 from T-R comparator 40. Volume control is provided by varying the potentiometer wiper arm of external potentiometer 42 and is connected at terminal 44 to the speakerphone. Thus, by increasing VLC by moving the wiper arm towards $V_B$, a modulated control voltage V is produced at the output of attenuator control circuit 12 via lead 34 to increase the gain of receive attenuator 16 while reducing the relative gain of transmit attenuator 14. The maximum gain/attenuation values of transmit and receive attenuators 14 and 16 are determined respectively by adjusting variable resistors 46 and 48 which are coupled to the attenuators at terminals 50 and 52.

In addition to operating in a transmit and receive mode, the speakerphone is operated in an idle mode. In the idle mode, no controlling speech signals are coupled to inputs 54 and 56. In this condition the outputs of transmit and receive level detectors 58 and 60, which are coupled respectfully to terminals 54 and 56, cause the output of comparator 40 to be in a high level state. Simultaneously, the voltage at terminal 62 (established across capacitor 64 and resistor 66) is sufficiently low which in conjunction with the output of detector 26 also being in a low level state causes the output of attenuator control circuit 12 to be at a value that reduces the gain of the two attenuators to some midrange value thereof.

The speakerphone is placed in a transmit mode when there is sufficient transmit signal, such as speech signal, present over and above any receive signal. In this event the relative outputs of transmit and receive level detectors 58 and 60 cause T-R comparator 40 to go to a high output level state. Simultaneously, background level detector 26 determines whether the transmit signal is a result of background noise or speech. If the signal is due to background noise, the attenuators are placed in the idle mode as described above. However, if the signal consists of speech, transmit and receive attenuators 14 and 16 will be switched to a transmit mode by background level detector 26 producing the appropriate control signal at the output of attenuator control circuit 12 to maximize the gain of transmit attenuator 14 while minimizing the gain of receive attenuator 16.

In a like manner, the speakerphone is placed in the receive mode by the output of attenuator control circuit 12 being switched accordingly when the output of T-R comparator 40 goes low. This occurs whenever there is sufficient receive signal supplied at terminal 20 to overcome any background noise and any speech signals appearing at output 18. In this situation the outputs of transmit and receive level detectors 58 and 60 are such to cause the output of T-R comparator 40 to go to its low level state. Hence, the gain of the receive attenuator 16 is maximized simultaneously with the gain of transmitted attenuator 14 being minimized by the output of attenuator control circuit 12.

As it is generally understood, transmit and receive attenuators 14 and 16 may be realized by conventional 2 or 4 quadrant multiplier circuits which are known to those skilled in the art. The gains of the attenuators are varied by varying the DC voltage drive supplied thereto accordingly. It is important, that the relative gains of attenuators 14 and 16 do not change over temperature. For the gain/attenuation of the multiplier circuits to have a zero temperature coefficient, the voltage which drives these multipliers must have a voltage temperature characteristics that varies in the same manner as that of the multipliers themselves. Attenuator control circuit 12 of the present invention provides such a voltage as will be hereinafter explained.

Figure 2:
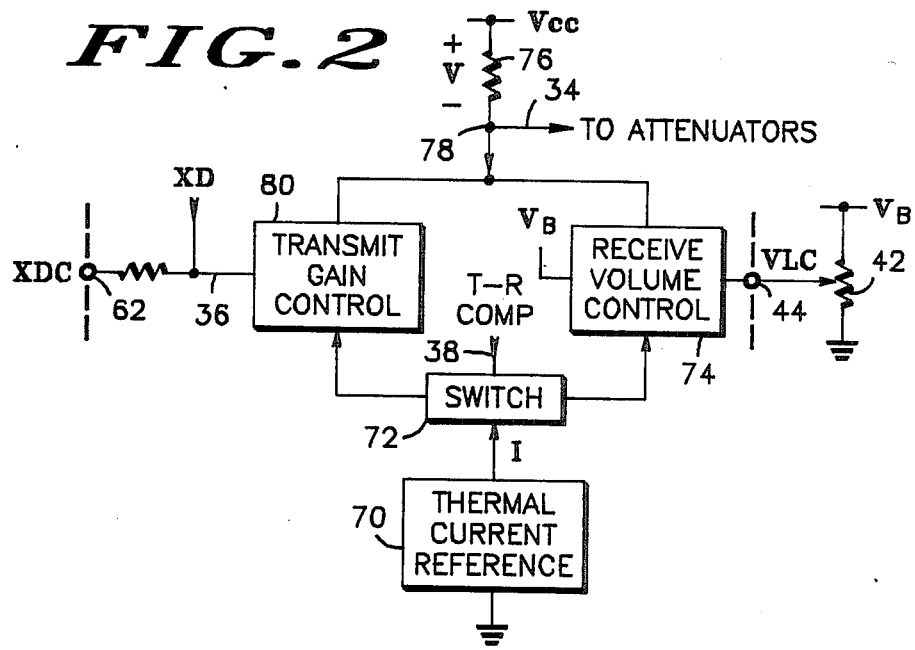
FIG. 2 is a partial schematic and block diagram illustrating the attenuator control circuit of the present invention.

Turning now to FIG. 2 there is illustrated a simplified schematic and block diagram of attenuator control circuit 12 of the present invention. Thermal current reference 70 produces a current I having a predetermined temperature coefficient. The current I flows through either receive volume control circuit 74 or transmit gain control circuit 80 depending upon the state of electronic switch 72. For example, in response to the output of T-R comparator 40 being low, the current I flows through receive voltage control circuit 74 to develop the corresponding voltage V across resistor 76 which is proportional to absolute temperature. Thus, the voltage at node 78 that appears over lead 34 to drive transmit and receive attenuators 14 and 16 has the same voltage-temperature characteristics as the attenuators. By varying the voltage VLC at input terminal 44 a proportional amount of current I is steered through resistor 76, i.e., the greater the value of VLC the greater amount of the current I that flows through resistor 76.

In response to the speakerphone being in a transmit mode, switch 72 renders receive volume control circuit 74 nonoperative while transmit gain control circuit 80 is rendered operative to permit the current I to flow through the latter. In the transmit mode the signal appearing on lead 36 is high such that none of the current I is steered to node 78, to flow through resistor 76. Hence, there is no voltage developed across resistor 76 and the voltage V developed is equal to zero. This results in the transmit and receive attenuators 14 and 16 being operated at maximum gain and maximum attenuation respectfully as the voltage appearing at lead 34 is the quiescent operating voltage $V_{CC}$.

In the idle mode, the current I flows through transmit gain control circuit 80 as during the transmit mode. However, in this event a current is steered to node 78 to produce a voltage drop across resistor 76 that is proportional to the value of the voltage appearing at node 62 produced across resistor 66 and capacitor 64. The voltage drop across resistor 76 in the idle mode is also proportional to absolute temperature such that the gains of the respective transmit and receive attenuators is not temperature dependent.

Figure 3:
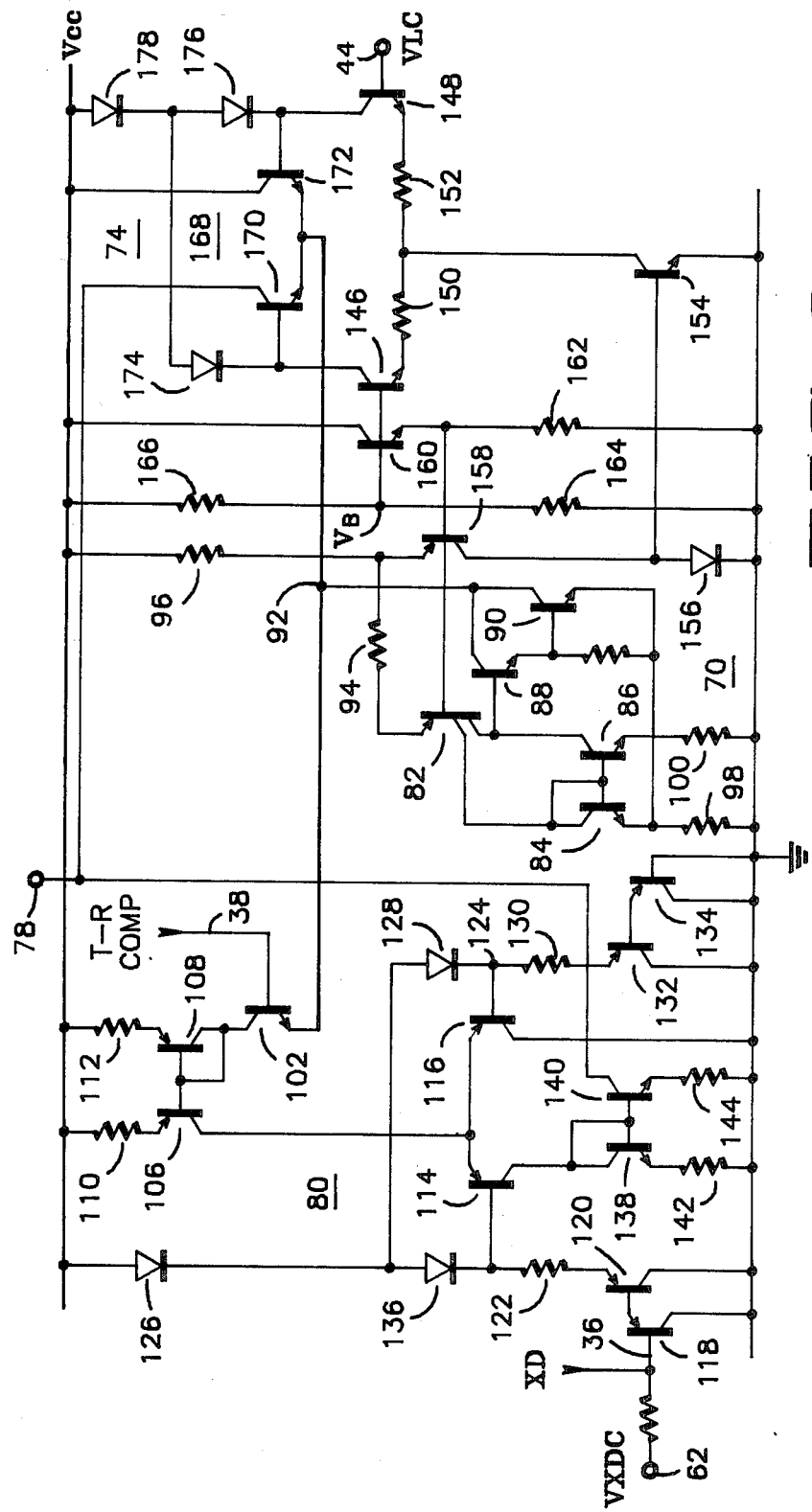
FIG. 3 is a detailed schematic diagram illustrating the attenuator control circuit of FIG. 2.

Referring now to FIG. 3, attenuator control circuit 12 is shown in full detail. Thermal current source 70 includes PNP transistor 82 interconnected with NPN transistors 84, 86, 88 and 90 to provide the thermal current I at node 92. Current source 70 is conventional in structure and the operation thereof is understood by those skilled in the art. Briefly, however, the emitter of transistor 82 is coupled via resistor 94 and 96 to $V_{CC}$, a source of substantially constant potential having a zero temperature coefficient. Transistor 82 is biased on by its base being biased at a potential less than $V_{CC}$ whereby equal currents flow from the two collectors thereof to the respective collectors of NPN transistors 84 and 86. Transistor 84 is connected as a diode and forms with transistor 86 a conventional current mirror circuit whereby the current flowing through transistor 86 is substantially equal to the current flowing through the diode connected transistor 84. The emitters of transistors 84 and 86 are coupled respectively through resistors 98 and 100 to ground reference. By area ratioing the effective emitter areas of transistors 84 and 86 the current densities of the two are substantially different. For example, by making the effective area of transistor 84 larger than the effective emitter area of transistor 86 a smaller base to emitter voltage is developed in the former which causes a delta voltage to be developed across resistor 98 which has a positive temperature coefficient. This voltage produces a current through resistor 98 which flows through Darlington configured transistors 88 and 90 to node 92. This current will also have a positive temperature coefficient due to the fact that it was produced by a positive temperature voltage established across resistor 98. Darlington configured transistors 88 and 90 also provide feedback from the collector of transistor 86 to the emitter of transistor 84 to ensure that the two collector currents flowing through transistors 84 and 86 are maintained substantially constant. Thus, a thermal current I is produced at node 92 which is steered to either receive volume control circuit 74 or transmit gain control circuit 80.

Transistor 102 which is coupled between receive volume control circuit 74 and transmit gain control circuit 80 to node 92 functions as an electronic switch whereby current is steered to one or the other of the two aforementioned circuits. For example, if the output of T-R comparator 40 is high, thermal current I flows through the current mirror comprising PNP transistors 106 and 108 and resistors 110 and 112 as transistor 102 is turned on. In this condition, the voltage developed at the emitter of transistor 102, which is one diode voltage drop below the voltage applied at the base thereof, is sufficient to render receive volume control circuit 74 nonoperative. Transmit gain control circuit 80 is now rendered operative whereby the current at node 92 flows through transistor 108 of the current mirror to produce a current through transistor 106 which is substantially equal in magnitude to the current flowing at node 92 and has the same temperature coefficient thereas. The current flowing through transistor 106 provides the "tail" current required by the comparator comprising differentially connected transistors 114 and 116, the emitters of which are commonly connected to the collector of transistor 106. Depending upon the output state of background level detector circuit 26 supplied via lead 36 to the input of the comparator at the base of transistors 118, and the voltage established at terminal 62, the collector current of transistor 106 is steered proportionally between transistors 114 and 116. As previously mentioned, with the speakerphone in a transmit mode, a high level output signal is supplied over lead 36 which will reverse bias PNP transistors 118 and 120, which are connected in a Darlington configuration and via resistor 122 to the base of transistor 114. Since these transistors are reverse biased, transistor 114 is rendered nonconductive as there is no path for base current flow therefrom. Therefore all of the tail current supplied from transistor 106 is steered through transistor 116 to ground reference through the collector of this transistor. Transistor 116 is biased in a conducting state since its base is connected at node 124 to which a substantially constant bias potential is established. The bias potential is developed through diodes 126 and 128 which are series connected between $V_{CC}$ and the base of transistor 116. Hence, current flows through the two diodes and via resistor 130 through Darlington configured PNP transistors 132 and 134 to ground reference. Since all of the tail current supplied at the common emitters of transistors 114 and 116 of the comparator is steered to ground, in this case one output of the comparator, there is no current flowing through node 78 and resistor 76 (FIG. 2). Thus, transmit attenuator 14 will be operated at maximum gain as previously described with receive attenuator 16 being set at maximum attenuation.

When the speakerphone is in a receive mode, the output of T-R comparator 40 is low which turns off transistor 102. Hence, no tail current is supplied to the transmit comparator. Thus, transmit gain control circuit 80 does not have any control over attenuator control circuit 12.

With the speakerphone operated in an idle mode, the input to the comparator, at the base of transistor 118, is a function of the voltage XDC. If XDC is less than the voltage established at node 124 transistors 118, 120 and 114 are turned on as a path for base current drive is now provided to transistor 114 through resistor 122. Diode 126 provides current flow therethrough from diode 136 through resistor 122. As transistor 114 is turned on one-half of the tail current supplied by transistor 106 is steered through the current mirror comprising NPN transistors 138 and 140. Transistor 138 is connected as a diode and has its emitter connected through resistor 142 to ground reference. Similarly, transistor 140 has its base connected to the collector-base of transistor 138 and its emitter coupled through resistor 144 to ground. The current steered through transistor 114 is mirrored at the collector of transistor 140 such that this current now flows through node 78 and resistor 76 to produce the modulated voltage V thereacross. The current flowing through node 78 has substantially the same temperature coefficient as the current produced by thermal current reference source 70. The magnitude of current steered at the output of the comparator (the collector of transistor 140) is a function of magnitude of the voltage VXDC.

As illustrated, receive volume control circuit 74 includes a differential amplifier circuit comprising NPN transistors 146 and 148 the emitters of which are commonly connected via resistors 150 and 152. A source of tail current is supplied to this differential amplifier at the interconnection of the two resistors by transistor 154 which has its collector emitter path coupled therebetween to ground. The base of transistor 154 is biased at a bias potential that is developed across diode 156. The bias current in diode 156 will have a zero temperature coefficient since the current through the diode is provided by transistor 158 via resistor 96 which are series coupled between $V_{CC}$ and the diode assuming that the current through resistor 94 is negligibly small in comparison to the current flow through resistor 96. Since the voltage $V_{CC}$ has a zero temperature coefficient the current through resistor 96, transistor 158 and diode 156 also has a zero temperature coefficient. The base of transistor 158 is connected with the base of PNP transistor 82 to the interconnection between the emitter of transistor 160 and resistor 162, the other side of which is connected to ground reference. The voltage resistor divider comprising resistor 164 and 166 connected between $V_{CC}$ and ground reference produces the potential, $V_B$, which is supplied at the base of transistor 160 and is substantially constant having a zero temperature coefficient. As illustrated, the base of transistor 146 is also connected to $V_B$ with the base of transistor 148 being connected at terminal 44 to the potentiometer 42. The external bias voltage VLC, applied to the base of transistor 148, also has a zero temperature coefficient such that the operation of the differential amplifier is independent of temperature. The outputs of the differential amplifier (the collectors of transistors 146 and 148) are connected through respective diodes 174 and 176 to $V_{CC}$ through diode 178.

Receive volume control circuit 74 also includes differential amplifier 168 formed by NPN transistors 170 and 172 the emitters of which are commonly connected to node 92 to thermal current reference source 70. The base electrodes of these two transistors are connected respectively to the collectors of transistors 146 and 148. The outputs of the differential amplifier are taken at the collectors of transistors 170 and 172 with the former being connected to node 78 to resistor 76 and the latter being connected to $V_{CC}$.

With transistor 102 in a nonconducting state the current I appearing at node 92 is steered to the common emitters of transistors of 170 and 172 of differential amplifier 168. This renders receive volume control 74 operative whereby the current flowing through transistors 170 and 172 is proportionally steered therethrough to node 78 and $V_{CC}$ depending on the magnitude of VLC. By varying VLC the magnitude of the current I flowing through transistor 170 can be varied with respect to the current flowing through transistor 172. For example, as VLC is increased, diode 176 is turned on harder to supply more collector current to transistor 148 which, in turn, causes transistor 172 to be rendered less conductive. This will allow more of the current I to be steered through transistor 170 to node 178 to increase the voltage V developed across resistor 76. Conversely, as VLC is decreased, diode 174 conducts harder which reduces the degree of conduction of transistor 170 as well as the magnitude of current I that is steered to node 78. It is understood that the proportional amount of current I steered to node 78 can be varied by ratioing resistors 150 and 152 accordingly.

The speakerphone is therefore operated in a receive mode whenever transistor 102 is turned off. Also, by varying VLC the volume of the receive signal path is increased as the voltage drive signal produced at node 78 and via lead 34 to transmit and receive attenuators 14 and 16 decreases which increases the gain of receive attenuator 16 while increasing the attenuation of the transmit attenuator 14.

Hence, what has been described above is a novel control circuit for producing a voltage drive signal that is proportional to absolute temperature. The control circuit can be used in many applications including controlling the gain/attenuation of the receive and transmit signal paths of a half-duplex operated speaker phone system.

We claim:

1. Circuit for providing an output signal having a temperature coefficient proportional to absolute temperature at an output, comprising:
   current source means for providing a current having a predetermined temperature coefficient;
   first current steering means coupled to said current source means for proportionally steering said current between first and second outputs thereof whenever said first current steering means is rendered operative, said first output of said first current steering means being coupled to the output of the circuit;
   second current steering means coupled to said current source means for proportionally steering a current having substantially the same temperature coefficient as said current provided by said current source means between first and second outputs whenever said second current steering means is rendered operative, said first output of said second current steering means being coupled to the output of the circuit;
   switch means coupled between said first and second current steering means and to said current source for rendering one of said first and second current steering means operative while the other is rendered non-operative in response to a control signal applied thereto.

2. Circuit for providing an ouput signal having a temperature coefficient proportional to absolute temperature at an output, comprising:
   current source means for providing a current having a predetermined temperature coefficient;
   first current steering means coupled to said current source means for proportionally steering said current between first and second outputs thereof whenever said first current steering means is rendered operative, said first output being coupled to the output of the circuit;
   second current steering means coupled to said current source means for proportionally steering a current having substantially the same temperature coefficient as said current provided by said current source means between first and second outputs whenever said second current steering means is rendered operative, said first output being coupled to the output of the circuit;

switch means coupled between said first and second current steering means to said current source for rendering one of said first and second current steering means operative while the other is rendered non-operative in response to a control signal applied thereto, said switch means includes a transistor having first, second and control electrodes, said first electrode being coupled both to said current source means and said first current steering means, said second electrode being coupled to said second current steering means, said control electrode receiving said control signal, said transistor providing said current to said second current steering means and rendering said first current steering means non-operative when said transistor is rendered conductive by said control signal, said switch means rendering said second current steering means non-operative when said transistor is rendered non-conductive whereby said current provided by said current source means flows through said first current steering means.

3. The circuit of claim 2 including a first power supply conductor at which is supplied an operating potential; and resistive means coupled between said first power supply conductor and the output of the circuit.

4. The circuit of claim 3 wherein said first current steering means includes:
a first differential amplifier having first and second inputs and outputs, said first input being coupled to an input terminal of the circuit at which is supplied a second control signal, said second input being supplied a substantially constant bias potential; and
a second differential amplifier having first and second inputs and outputs and a common terminal, said common terminal being coupled to said first electrode of said transistor and to said current source means, said first and second inputs being coupled respectively to said first and second outputs of said first differential amplifier, said first output being said output of said first current steering means and said second output being coupled to said first power supply conductor.

5. The circuit of claim 4 wherein said first current steering means includes first and second diode means coupled between said first power supply conductor and said first and second inputs respectively of said second differential amplifier.

6. The circuit of claim 5 wherein said first current steering means includes third diode means connected between said first power supply conductor and said first and second diode means.

7. The circuit of claim 2 wherein said second current steering means includes:

first current mirror means coupled to said second electrode of said transistor and being responsive to said transistor being turned on for providing current at an output thereof the magnitude and temperature coefficient of which are substantially the same as said current provided by said current source means; and comparator means having first and second inputs and outputs and a common terminal, said common terminal being coupled to said output of said first current mirror means, said first and second outputs being said first and second outputs of said second current steering means respectively, said first input being biased at a first bias potential, said second input receiving a second control signal such that current related to said first current mirror output current is steered to said first output when said second control signal is at a first level and steered to said second output when said second control signal is at a second level.

8. The circuit of claim 7 wherein said comparator means includes second current mirror means for providing said related current to said first output of said comparator means.

9. The circuit of claim 8 including:
first and second power supply conductors at which are supplied an operating potential and ground reference signal respectively;
resistive means connected between said first power supply conductor and the output of the circuit; and
said second output of said comparator means being coupled to said second power supply conductor.

10. The circuit of claim 9 wherein said first current steering means includes:
a first differential amplifier having first and second inputs and outputs, said first input being coupled to an input terminal of the circuit at which is supplied a third control signal, said second input being supplied a substantially constant bias potential; and
a second differential amplifier having first and second inputs and outputs and a common terminal, said common terminal being coupled to said first electrode of said transistor and to said current source means, said first and second inputs being coupled respectively to said first and second outputs of said first differential amplifier, said first output being said output of said first current steering means and said second output being coupled to said first power supply conductor.

11. The circuit of claim 10 wherein said first current steering means includes first and second diode means coupled between said first power supply conductor and said first and second inputs respectively of said second differential amplifier.

12. The circuit of claim 11 wherein said first current steering means includes third diode means connected between said first power supply conductor and said first and second diode means.

* * * * *